United States Patent
Hundemer et al.

(10) Patent No.: US 8,744,186 B1
(45) Date of Patent: Jun. 3, 2014

(54) SYSTEMS AND METHODS FOR IDENTIFYING A SCENE-CHANGE/NON-SCENE-CHANGE TRANSITION BETWEEN FRAMES

(71) Applicant: Tribune Broadcasting Company, LLC, Chicago, IL (US)

(72) Inventors: Hank J. Hundemer, Bellevue, KY (US); Dana A. Lasher, Morgan Hill, CA (US)

(73) Assignee: Tribune Broadcasting Company, LLC, Chicago, IL (US)

( * ) Notice: Subject to any disclaimer, the term of this patent is extended or adjusted under 35 U.S.C. 154(b) by 65 days.

(21) Appl. No.: 13/629,446

(22) Filed: Sep. 27, 2012

Related U.S. Application Data

(60) Provisional application No. 61/542,077, filed on Sep. 30, 2011, provisional application No. 61/542,103, filed on Sep. 30, 2011.

(51) Int. Cl.
*G06K 9/00* (2006.01)

(52) U.S. Cl.
USPC .......................................... 382/173; 382/165

(58) Field of Classification Search
USPC ................ 382/162, 164, 165, 172, 173, 274; 348/155, 208.11, 222.1, 687, 699, 700
See application file for complete search history.

(56) References Cited

U.S. PATENT DOCUMENTS

| | | | |
|---|---|---|---|
| 5,751,378 A * | 5/1998 | Chen et al. | 348/700 |
| 5,801,765 A * | 9/1998 | Gotoh et al. | 348/155 |
| 6,195,458 B1 | 2/2001 | Warnick et al. | |
| 6,606,409 B2 | 8/2003 | Warnick et al. | |
| 6,721,361 B1 | 4/2004 | Covell et al. | |
| 6,724,933 B1 | 4/2004 | Lin et al. | |
| 6,778,224 B2 | 8/2004 | Dagtas et al. | |
| 8,063,946 B2 * | 11/2011 | Asoma | 348/222.1 |
| 8,130,325 B2 * | 3/2012 | Iwakura et al. | 348/687 |
| 8,508,612 B2 * | 8/2013 | Cote et al. | 348/222.1 |
| 2006/0026628 A1 | 2/2006 | Wan et al. | |
| 2009/0249386 A1 | 10/2009 | Shan et al. | |
| 2011/0051010 A1 * | 3/2011 | Jiossy et al. | 348/700 |
| 2012/0188386 A1 * | 7/2012 | Kulkarni et al. | 348/208.11 |

* cited by examiner

*Primary Examiner* — Amir Alavi

(74) *Attorney, Agent, or Firm* — McDonnell Boehnen Hulbert & Berghoff LLP

(57) ABSTRACT

Presently disclosed are systems and methods for identifying a scene-change/non-scene-change transition between frames. One embodiment takes the form of a method that, with respect to a current frame pair that includes first and second current frames, includes: (i) defining a first region of said first current frame and a second region of said second current frame; (ii) generating a first luma table based on said first region and a second luma table based on said second region, wherein said luma tables each have a luma counter for each luma in a luma range; (iii) for each luma in said luma range, calculating a first value based on said luma counters and adding said first value to an accumulator; (iv) calculating a second value based on said accumulator; and (v) identifying the current frame pair as having a scene-change transition responsive to the second value being less than a scene-change threshold.

20 Claims, 5 Drawing Sheets

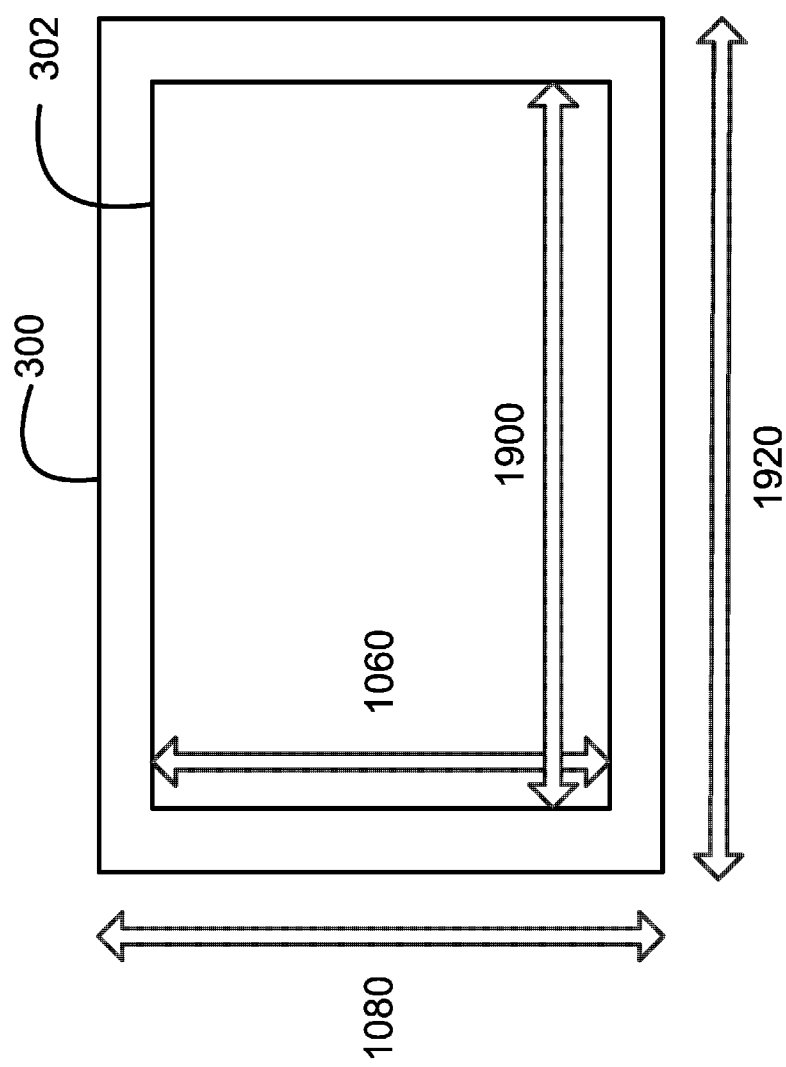

| ● | ↙ 400 |
|---|---|
| LUMA | COUNTER |
| 0 | 3 |
| 1 | 20 |
| 2 | 2 |
| 3 | 0 |
| ... | ... |
| 252 | 30 |
| 253 | 5 |
| 254 | 0 |
| 255 | 40 |

| ○ | ↙ 500 |
|---|---|
| LUMA | COUNTER |
| 0 | 10 |
| 1 | 22 |
| 2 | 10 |
| 3 | 1 |
| ... | ... |
| 252 | 40 |
| 253 | 11 |
| 254 | 0 |
| 255 | 30 |

SYSTEMS AND METHODS FOR IDENTIFYING A SCENE-CHANGE/NON-SCENE-CHANGE TRANSITION BETWEEN FRAMES

CROSS REFERENCE TO RELATED APPLICATIONS

This application claims priority to U.S. Provisional Patent Application Ser. No. 61/542,077, entitled "System and Method for Automated Video Content Tagging," filed on Sep. 30, 2011 and U.S. Provisional Patent Application Ser. No. 61/542,103, entitled "System and Method for a Master Controller," filed on Sep. 30, 2011, both of which are hereby incorporated by reference herein in their entirety.

This application also relates to U.S. patent application Ser. No. 13/629,405, entitled "Systems and Methods for Identifying a Black/Non-Black Frame Attribute," U.S. patent application Ser. No. 13/629,481, entitled "Systems and Methods for Identifying a Colorbar/Non-Colorbar Frame Attribute," U.S. patent application Ser. No. 13/629,495, entitled "Systems and Methods for Identifying a Video Aspect-Ratio Frame Attribute," U.S. patent application Ser. No. 13/629,430, entitled "Systems and Methods for Identifying a Mute/Sound Frame Attribute," and U.S. patent application Ser. No. 13/629,497, entitled "Systems and Methods for Electronically Tagging a Video Component in a Video Package," all of which are commonly assigned to the assignee of the present application, are filed simultaneously, and are hereby incorporated by reference herein in their entirety.

USAGE AND TERMINOLOGY

Throughout this application, with respect to all reasonable derivatives of such terms, and unless otherwise specified (and/or unless the particular context clearly dictates otherwise), each usage of:

"a" or "an" is meant to read as "at least one."

"the" is meant to be read as "the at least one."

the term "video" refers broadly to any material represented in a video format (i.e., having a plurality of frames). In some instances, video may include a plurality of sequential frames that are identical or nearly identical, and that may give the impression of a "still" image. Video may also include frames that merely show a black screen, colorbars, testing data, or other traditionally non-substantive content. It should be noted that while non-substantive content may have little or no utility to a typical viewer, it provides useful information for the purpose of the techniques described throughout this disclosure. Video may or may not include an audio portion.

the term "video component" (VC) refers to video that one of ordinary skill in the art would typically consider to be self-contained, and that is typically separately scheduled by a scheduling-and-sequencing system (also commonly referred to as a traffic system) in a broadcasting environment. There are several types of VCs, including for example a show-segment VC, a barter VC, and a promotion VC. A show-segment VC consists of at least a portion of a show, and potentially one or more commercials, all of which are grouped together and considered as one unit for the purpose of scheduling-and-sequencing. A show may be, for example, an episode of a sitcom, a news program, or a movie. A barter VC consists of one or more commercials, all of which are grouped together and considered as one unit for the purpose of scheduling-and-sequencing. A barter VC is a subset of a show-segment VC, namely the portion including the one or more commercials. A promotion VC consists of a promotion or advertisement (e.g., for an associated show).

the term "video package" refers to a collection of VCs and other video, all of which has a logical or other relationship or association. Typically, the video package includes a plurality of sequentially ordered VCs that are separated by other video (e.g., black frames), although the video package may have the technical appearance of being a single, continuous piece of video when analyzed using traditional methods. Each video package includes at least one, and often a group of show-segment VCs that are intended to be aired during a corresponding thirty-minute, one-hour, two-hour, or other predefined time slot. Though not required, a video package is often created by a show syndicator and provided to a broadcaster.

the term "scene change transition" refers to a pair of (typically adjacent) video frames that are contained in different recordings or "cuts." For example, consider video showing two individuals in an interview, but that toggles back and forth between recordings from two cameras (e.g., with each camera facing a different individual). In this video, each toggle represents a scene change transition. Scene change transitions may also result from the change of a scene to some non-substantive content and vice-versa. For example, consider video having a first VC that is a show-segment VC, followed by a series of black frames, followed by a second VC that is a barter VC. The change from the last frame of the show segment VC to the first black frame represents a scene change, as does the change from the last black frame to the first frame of the barter VC. Further, scene change transitions may result from the change between one type of non-substantive content to another. For example, a change from a black frame to a colorbar frame would be considered a scene change. Finally, it should also be noted that a single recording or cut of video filmed using a moving camera generally is not considered to contain a scene change transition, however in some instances, it may be desired to consider certain types of frames within such a recording to be sufficient for indicating a scene change transition. For example, it may be desired that a flash of lightning creates a scene change transition effectively dividing an otherwise continuous scene into two separate scenes.

TECHNICAL FIELD

The present systems and methods relate to video analysis and, more particularly, to systems and methods for identifying a scene-change/non-scene-change transition between frames.

BACKGROUND

Video technology relates to electronically capturing, processing, recording, and reconstructing a sequence of still images referred to as frames, so as to represent motion. Video includes a number of frames based on a predefined frame rate. For example, in the U.S., the Advanced Television Systems Committee ("ATSC") establishes a standard frame rate of 29.97 frames/second for video used for commercial broadcasting.

For video transmitted via a digital video signal (e.g., based on the high definition serial digital interface (HD-SDI) standard), each frame is represented by a number of pixels commonly described as the smallest unit of an image that can be represented or controlled. The number of pixels in a frame is based on a predefined resolution of the frame (typically defined by a number of columns and rows of pixels). For example, a frame having a resolution of 1920 columns and 1080 rows is referred to as 1920×1080 and is represented by the arithmetic product of approximately 2,073,600 pixels. Pixels have many attributes, including for example, chrominance values that represent color, and luma values (referred to herein as lumas) that represent brightness. Once captured and processed, video is typically encoded and recorded as a digital file. Thereafter, the file is retrieved and the video is reconstructed by decoding the file.

Recorded video is also often edited by a user. For example, a user may modify pixel attributes to alter a video's color saturation, brightness, and/or other properties. In addition, a user may edit a video's duration and/or its timeline by marking, cropping, splitting, combining, and/or rearranging select portions of the video into one or more files. Traditionally, such editing required a user to physically cut and rearrange portions of film embodying the video, but with the advent of digital files, most video editing is performed by a user interfacing with a computer software program.

While such software programs have made it easier for users to edit video, the editing process is still often difficult and time-consuming. Among other things, users often find it difficult to locate and focus on the appropriate portions of video that need to be edited.

SUMMARY

Disclosed herein are systems and methods for identifying a scene-change/non-scene-change transition between frames, such systems and methods providing several advantages.

One example advantage of the presently disclosed systems and methods is the ability to identify a scene-change/non-scene-change transition between frames while minimizing or eliminating false-positive and false-negative results.

Another example advantage of the presently disclosed systems and methods is the ability to identify a scene-change/non-scene-change transition between frames while minimizing the use of system resources.

Another example advantage of the presently disclosed systems and methods is the ability to identify a scene-change/non-scene-change transition for a plurality of frames (based on frame pairs) of video while contemporaneously processing each frame to create an encoded file, and wherein corresponding steps for each frame pair are performed during an execution time period that is less than a reciprocal of a frame rate of the video.

Various embodiments of the presently disclosed systems and methods may have none, some, or all of these advantages. Other advantages will be readily apparent to one of ordinary skill in the art.

A first example embodiment takes the form of a non-transitory computer-readable medium containing instructions that, when executed by a processor, cause a set of steps to be carried out for identifying a scene-change/non-scene-change transition for a current frame pair having a first current frame and a second current frame. The set of steps includes: (i) receiving the first current frame and the second current frame; (ii) defining a first region of the first current frame and a second region of the second current frame, wherein the regions each have a plurality of lumas within a luma range; (iii) generating a first luma table based on the first region and a second luma table based on the second region, wherein the luma tables each have a luma counter for each luma in the luma range based on the lumas in the corresponding region; (iv) for each luma in the luma range, (a) calculating a first value as a first function of the corresponding luma counter in the first luma table and the corresponding luma counter in the second luma table, (b) calculating a second value as a second function of the first value, and (c) adding the second value to an accumulator, (v) calculating a third value as a function of the accumulator; (vi) identifying the current frame pair as having a scene-change transition responsive to the third value being less than a scene-change threshold, and (vii) storing an indication of an associated scene-change/non-scene-change transition in a memory.

A second example embodiment takes the form of a frame-processing device that includes a processor and the non-transitory computer-readable medium described in the preceding paragraph.

A third example embodiment takes the form of the method described two paragraphs above this one, where the current frame pair is received from a source device.

BRIEF DESCRIPTION OF THE DRAWINGS

For a more complete understanding of the presently disclosed systems and methods, reference is now made to the following descriptions, taken in conjunction with the accompanying drawings, in which:

FIG. 3 depicts an example of a frame and a region in accordance with at least one embodiment.

DETAILED DESCRIPTION OF THE DRAWINGS

The present systems and methods provide techniques for identifying scene-change/non-scene-change transitions between video frames. Identifying these transitions provide benefits in a variety of applications, such as analyzing systems, identifying commercials, assisting with video and/or audio editing, and electronically tagging a VC in a video package as described in greater detail below, just to name some examples.

Figure 1:
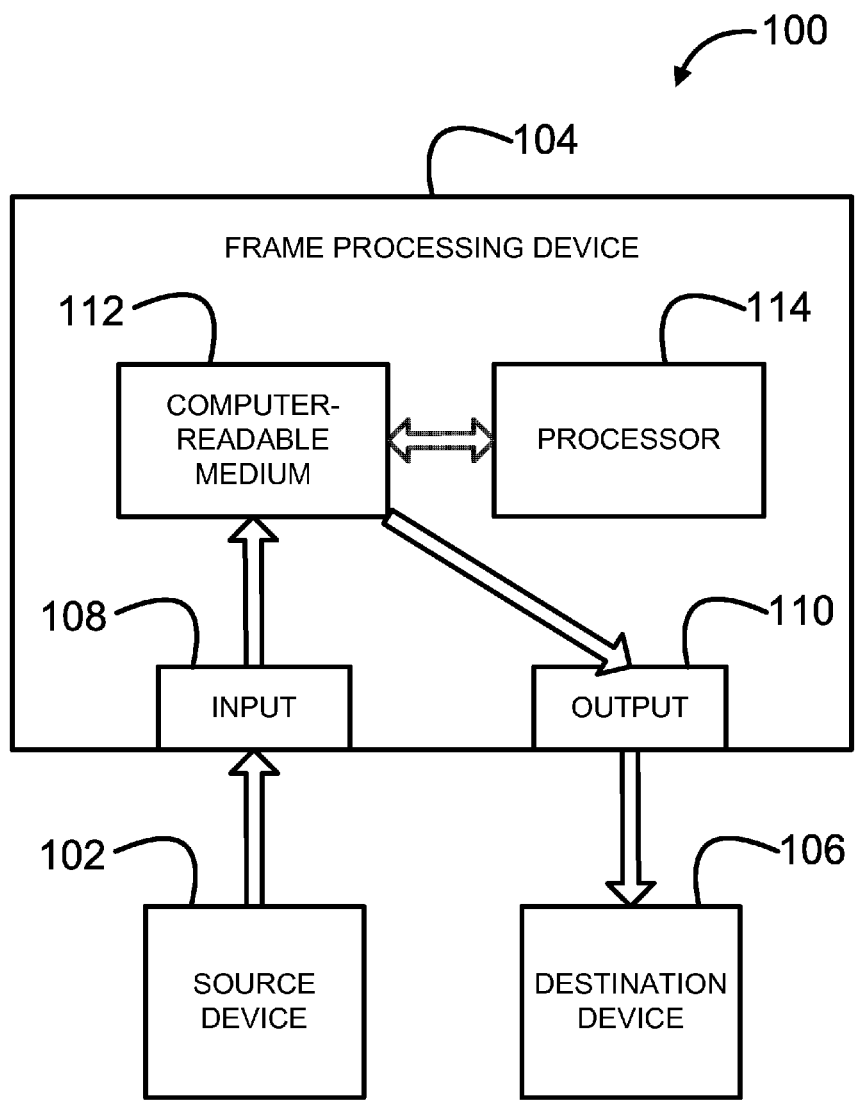
FIG. 1 is an example of a system in accordance with at least one embodiment.

Turning now to FIG. 1, an example system is provided and is generally designated 100. Included in the system 100 are a source device 102, a frame-processing device 104, and a destination device 106. Example source devices 102 include satellite receivers, decoders, baseband fiber transcoders, DVD players, Internet-delivery-based playout devices (e.g. Pathfire devices provided by DG FastChannel, Inc. of Irving, Tex.), and other frame-processing devices.

The frame-processing device 104 includes a video input connection 108 and is configured for receiving video via the video input connection from the source device 102. In at least one embodiment, the frame-processing device 104 is configured for receiving raw baseband video based on the HD-SDI standard with a data transfer rate in the range of 1.4 Gbps-1.6 Gbps (and typically approximately 1.485 Gbps). Throughout this application, unless otherwise stated, all disclosed ranges are inclusive of the stated bound values. It is contemplated that the frame-processing device 104 is optionally configured for receiving video based on other standards including but not limited to those defined by the Society of Motion Picture and Television Engineers ("SMPTE") as well as those of the ATSC. In another non-limiting embodiment, the frame-processing device is configured for receiving video based on a standard that supports a 480i video mode with a data transfer rate of approximately 270 Mbps.

A video output connection 110 on the frame-processing device 104 is configured for sending video to a destination device 106 (for, e.g., playout of the video, which may include one or more of the example source devices listed above). Further, the frame-processing device 104 includes a non-transitory computer-readable medium 112 and a processor 114. The video input connection 108, the video output connection 110, the computer-readable medium 112, and the processor 114 may all be directly or indirectly electronically connected. Moreover, the video frame-processing device 104, the source device 102, and the destination device 106, may all be directly or indirectly electronically connected (in one embodiment via the video input connection 108 and the video output connection 110).

Figure 2A:
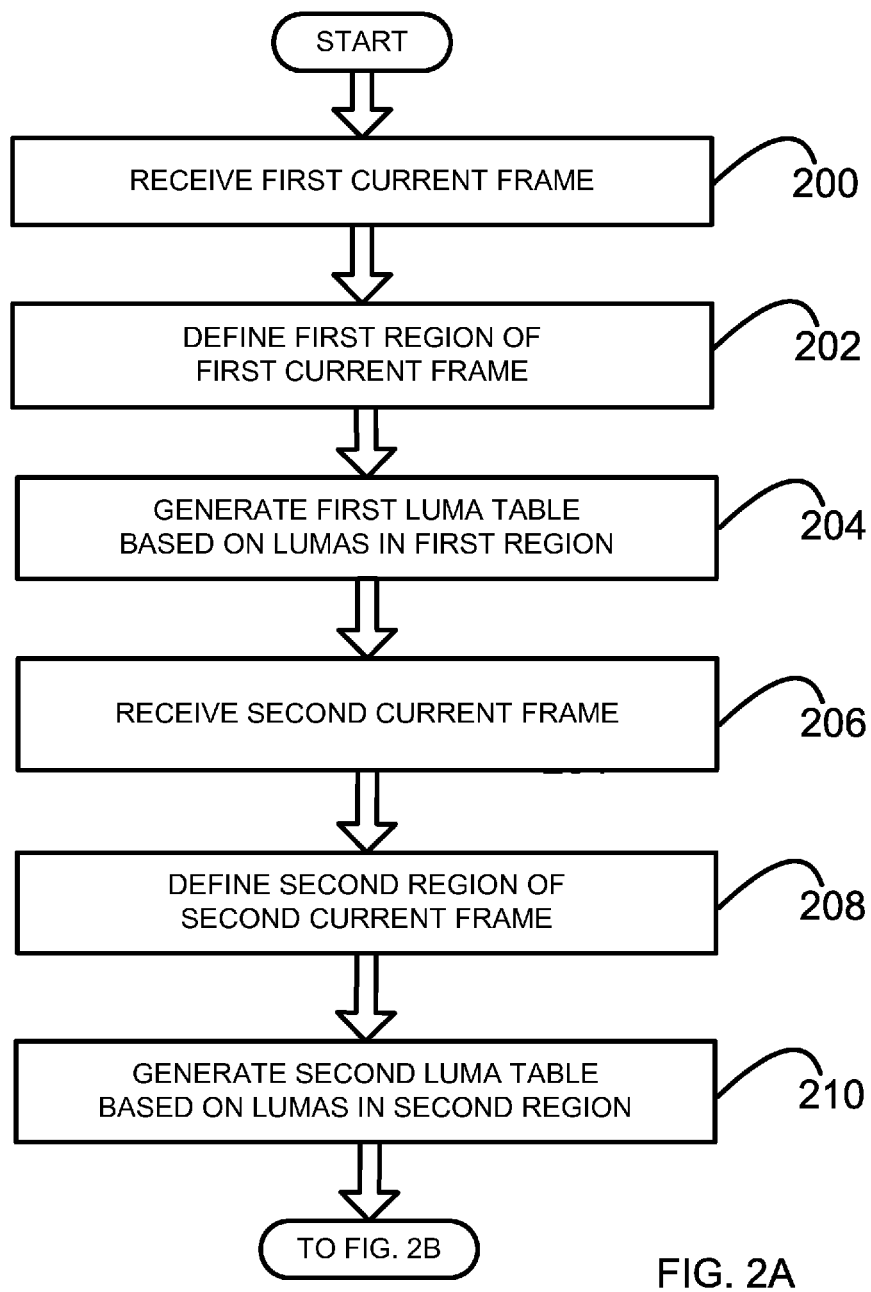
FIG. 2 (FIGS. 2A and 2B) is a flow chart illustrating an example of a method in accordance with at least one embodiment.
Figure 2B:
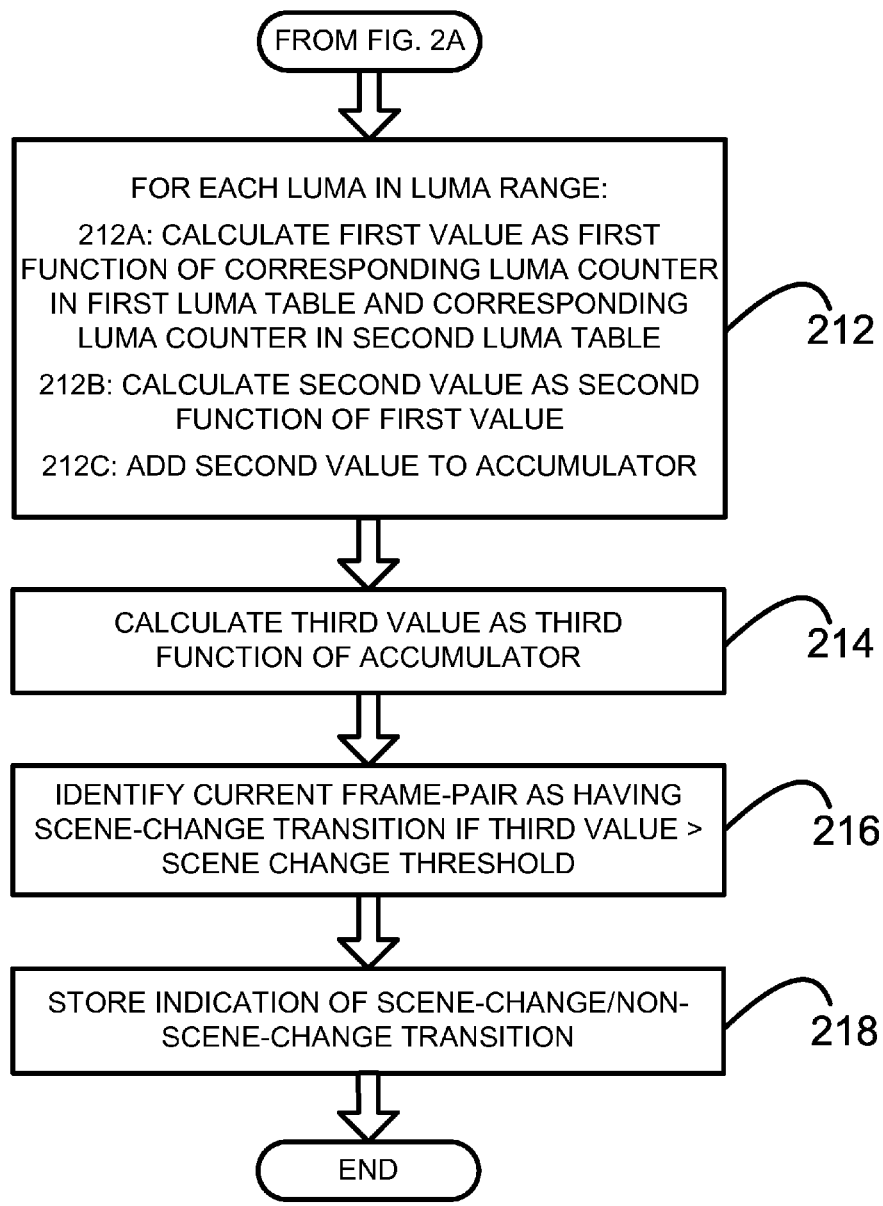

The computer-readable medium 112 contains instructions that, when executed by the processor 114, cause a set of steps to be carried out for identifying a scene-change/non-scene-change transition between frames. Turning now to FIG. 2, a flow chart illustrating the set of steps, and an example of the present method embodiment, is shown. It is noted that, here and throughout this application, the described steps need not be performed in the disclosed order, unless context dictates otherwise. Also, not all steps need to be performed to achieve the various advantages of the presents system and methods, and therefore not all steps are required.

As discussed, video includes a plurality of frames, and in at least one embodiment, the present method is applied to each adjacent frame pair within the plurality of frames. However, for clarity, the present method is described herein with reference to a "current frame pair" (referring to two adjacent frames) of the video being received from the source device 102 (e.g., as the source device plays out the video) by the frame-processing device 104 (via the video input connection 108). The two frames within the current frame pair are referred to herein as a "first current frame" and a "second current frame."

At step 200, a first current frame of the video is received. As discussed above, a frame is represented as a plurality of pixels, with each pixel having a luma representing a level of brightness within a luma range. The present systems and methods analyze lumas to identify a scene-change/non-scene-change transition between a current frame pair. Such an approach reduces the use of system resources as compared to, for example, the high processing power required to analyze chrominance values.

In some embodiments, the luma range may be defined by the video format. For example, 8-bit video may define a luma range of 0-255, while 10-bit video may define a luma range of 0-1023. However, in in some instances, it may be desired to modify the defined luma range, such as to exclude so-called super-white and super-black levels that typically are not captured when the video is recorded. For example, for 10-bit video, a narrowed luma range of 64-940 may be used. In some embodiments, it may be desired to modify the defined luma range by using bit-shifting techniques. For example, by performing two right bit-shifts on the 10-bit video luma range of 0-1023, the luma range is reduced to 0-255. Among other things, this may allow for more efficient processing for calculations that involve luma values. For the described embodiments, this bit shifted luma range of 0-255 will be referenced (with 0 representing no brightness, i.e., completely black, and 255 representing full brightness, i.e., completely white), but as described above, different ranges are also contemplated and can be used.

At step 202, a first region of the first current frame is defined. An example of a first current frame 300 and a corresponding first region 302 are shown in FIG. 3 (not drawn strictly to scale). While the first region 302 optionally includes the entire first current frame 300, in one embodiment, the first region 302 defines a lesser portion of the first current frame 300. In one embodiment, the first region 302 is a generally rectangular-shaped portion of the first current frame 300 and is defined by a left-bound column, a right-bound column, a top-bound row, and a bottom-bound row. For a first current frame 300 having a resolution of approximately 1920×1080, in one embodiment, the left-bound column is a value in a range 8-30, the right-bound column is a value in a range 1890-1912, the top-bound row is a value in a range 0-30, and the bottom-bound row is a value in a range 1050-1080. In a particular embodiment, the values are 10, 1910, 10, and 1070, respectively (thereby defining a first region 302 having a resolution of approximately 1900×1060).

For frames having alternative resolutions, the bound ranges and values may be modified as desired and/or appropriate. In some embodiments, such modification may include proportionally scaling the ranges and/or values. In other embodiments, it may be desired to increase the size of the region, while generally maintaining the proximity of the borders of the region to the borders of the frame (since this is where static and noise typically occurs). Indeed, the specific size and shape of the region may vary to suit the application.

Since the first current frame 300 includes lumas associated with each pixel, the corresponding first region 302 defines a set of lumas that are used to generate a first luma table. Use of the first region 302 helps to filter out portions of the first current frame 300 that are likely to be affected by static or noise, and also reduces the use of system resources as fewer lumas are analyzed. Notably, static or noise often occurs near the edges, and particularly the left and right edges, of a frame (as a result of, e.g., clock heterodyne artifacts resulting from old transmission methods). At step 204, a first luma table is generated that has a luma counter for each luma in the luma range based on the lumas in the first region 302. An example first luma table 400 of the first region 302 is shown in FIG. 4.

The above-described steps 200-204 are then performed with respect to a second current frame. As such, at step 206 a second current frame (not shown) is received, at step 208 a second region of the second current frame is defined (preferably the first region 302 and the second region have the same sizes and shapes), and at step 210, a second luma table is generated that has a luma counter for each luma in the luma range based on the lumas in the second region. An example second luma table 500 of the second region is shown in FIG. 5.

To promote efficiency, in at least one embodiment the luma tables 400, 500 are stored in a register memory (e.g., cache) included on (or at least accessible to) the processor 114. Such a configuration greatly improves the speed at which values in the luma tables 400, 500 are retrieved, thereby increasing the execution speed of the present method.

Figures 4, 5, 6:
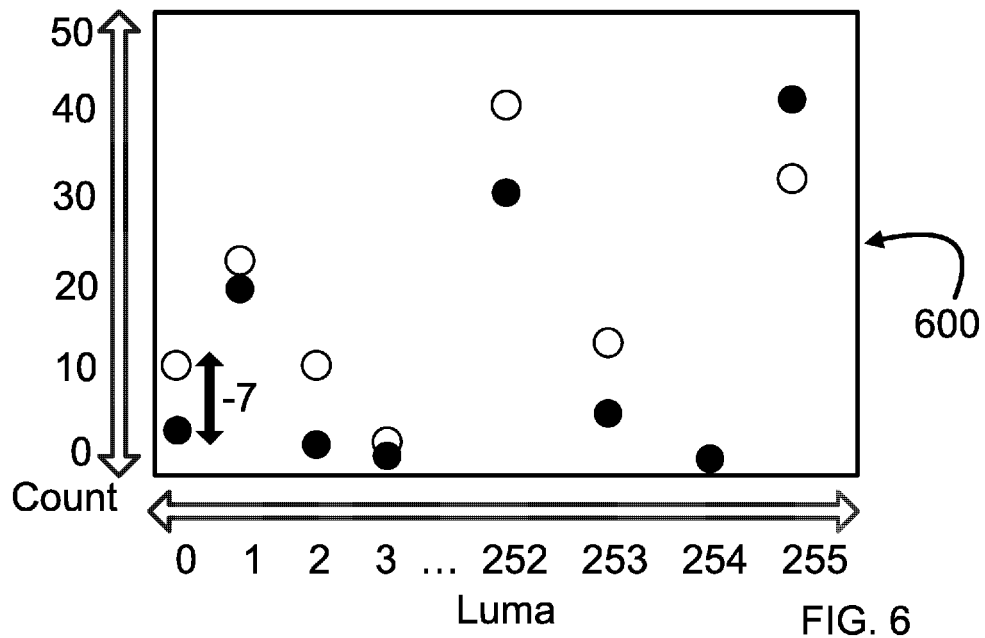
FIG. 4 depicts an example of a luma table of a first frame in accordance with at least one embodiment.
FIG. 5 depicts an example of a luma table of a second frame in accordance with at least one embodiment.
FIG. 6 depicts an example of a graphical representation of the luma tables in FIGS. 4 and 5.

FIG. 6 shows a graphical representation 600 of the values in the first and second luma tables 400, 500. In FIG. 6, the plotted values representing the first region 302 (i.e., those values that are stored in the first luma table 400) are shown with solid black circles, while the plotted values representing the second region (i.e., those values that are stored in the second luma table 500) are shown with solid white circles outlined in black.

Due to the relatively high frame rate of digital video signals (e.g., 29.97), the amount of content that changes between two adjacent frames is generally minimal, provided that they are not separated by a scene-change transition. This change in content is in part represented by a change in luma values. As shown in FIGS. 4-6, in one example, for the luma 0, the counter for that luma in the first region 300 is 3, while the counter for that luma in the second region is 10, thereby resulting in a counter difference of −7 (shown with a solid black vertical arrow in the lower-left-hand corner of FIG. 6).

As discussed above, for frame pairs that are not separated by a scene-change transition, these counter differences are likely to be relatively small. However, for frame pairs that are separated by a scene-change transition, the luma counters are likely to be greatly scattered from one frame to the next, and therefore the counter differences are likely to be significant. As discussed below, these counter differences are considered in determining whether to identify a scene change/non-scene-change transition between frames.

At step 212, for each luma in the luma range, three sub-steps 212A-C are performed. At sub-step 212A, a first value is calculated as a first function of a corresponding luma counter in the first luma table 400 and a corresponding luma table 500. In one embodiment, the first function is a subtraction function, which thereby results in the first value representing the difference between luma counters in the current frame pair (or vice-versa) as discussed above. As discussed above, in the illustrated example, this results in a first value of −7 (i.e., 3 minus 10). The use of a subtraction function provides a first value that represents a counter difference between frames for a particular luma in the luma range. In the next sub-step, the magnitude of the first value (e.g., the degree of the counter difference) is considered.

Accordingly, at sub-step 212B, a second value is calculated as a second function of the first value. In one embodiment, the second function is an exponential increase function, and more preferably, is a "squared" function. Therefore, following the example above, the first value of −7 is squared (i.e., $(-7)\hat{}2$) resulting in a second value of 49. This step provides at least two benefits in instances where the first function is a subtraction function. First, by using an even number as the exponential increase factor (e.g., 2), the sign (i.e., +/−) of the first value (i.e., the counter difference) is rendered irrelevant, and thus only the magnitude of the first value is considered. Second, by exponentially increasing the first value, larger differences in luma counters between frames are progressively magnified. Indeed, while a first value of 2 results in a second value of 4 (i.e., $2\hat{}2$), a first value of 10 results in a second value of 100. The effects of the progressive magnification will be apparent when considering the next sub-step.

At sub-step 212C, the second value is added to an accumulator (which in at least one embodiment is initialed (e.g., set equal to 0) before step 212). As discussed above, at step 212, each of the three sub-steps are performed for each of the lumas in the luma range. As such, the accumulator either increases or remains unchanged after each of the iterations though the luma range. And when, as described above by way of example, an exponential-increase (e.g., "squared") function is used as the second function, the accumulator by design will increase quickly as a result of substantial changes in lumas between frames.

At step 214, a third value is calculated as a function of the accumulator, such function being referred to herein at times as the third function. In at least one embodiment, the third function is an inverse of the second function, and therefore in at least one embodiment the third function is a square-root function. The third function therefore reduces the magnified accumulator (e.g., resulting from a sum of magnified difference counters) based on an inverse function. Notably, inverse-exponential functions are computationally expensive and require considerable system resources, and therefore in at least one embodiment, such calculations are performed sparingly. Through use of the accumulator, the present method avoids applying the square-root function for each luma in the luma range, and instead only applies the function once on the accumulator (i.e., once per current frame pair).

At step 216, the current frame pair is identified as having a scene-change transition responsive to a condition being satisfied, namely the third value being less than a scene-change threshold, which in one embodiment is a value in a range 118-138, and in a particular embodiment is equal to 128. In one embodiment, responsive to the current frame pair not being identified as having a scene-change transition, the current frame pair is identified as having a non-scene-change transition. At step 218, an indication (such as a Boolean "true" or "false") of the associated scene-change/non-scene-change transition is stored in a memory (e.g., in the computer-readable medium 112), among other things, for later retrieval and use by other applications.

In at least one embodiment, the appropriate steps of the present method are performed on a plurality of frames (based on corresponding frame pairs) of baseband video in real time or near real time as the frames are received via the video input connection 108. Such a configuration provides for performing the above-described steps while contemporaneously processing each frame to create an encoded file representing the video. Notably, when processing frames in real time or near real time (e.g., through use of a frame buffer), there is an inherent limitation in that the above-described steps applied to each frame pair must be performed during an execution time period that is less than a reciprocal of the frame rate of the video (e.g., the steps of the present method must be performed within (1/29.97) seconds for video having a frame rate of 29.97 frames per second). Note that once a pair of luma tables have been generated for a given frame pair (having frames A and B), when the next frame pair is analyzed (i.e., frame B and a next frame C), the luma table for the frame B that has already been generated is used in the analysis. As such, due to this ripple effect, after the first frame pair has been analyzed, it may be appropriate to say that the above-described steps applied to each frame pair must be performed during an execution time period that is less than a reciprocal of the frame rate of the video Such time constraints present considerable challenges, particularly when the video is being transferred at a high data rate as the amount of data and the complexity of the calculations carried out by the processor 114 increase. However, due at least in part to the various optimization techniques that are described throughout this disclosure, the present method can be performed within limited time constraints and/or with a reduced use of system resources.

Notably, a frame-transition table (or other data structure such as a linked list) may be used to store the indication of the associated scene-change/non-scene-change transition in a memory as described above. As such, in one embodiment, a table may store such indications for all frames of a video package.

As one example of the efficiency of the present method, testing shows that the steps of the present method are capable of being performed contemporaneously while processing each frame for video based on the HD-SDI standard (i.e., having a transfer rate of approximately 1.485 Gbps and a frame rate of 29.97 frames per second) using a quad-core processor, with each core having a speed of 2 GHz (e.g., a Xeon E5405 processor provided by Intel® of Santa Clara, Calif.).

One particularly beneficial application of the presently disclosed systems and methods is for use with systems and methods for electronically tagging a VC in a video package as described in the cross-referenced U.S. patent application Ser. No. 13/629,497. As discussed therein, the ability to identify a scene-change/non-scene-change transition between frames with minimal processing power is particularly advantageous as some embodiments of the disclosed systems and methods for electronically tagging a VC in a video package rely not only on the identification of colorbar/non-colorbar frame attributes, but also on the identification of several other frame attributes that, even when combined, are restricted by (and carried out within) the frame-rate time constraints described above.

In some embodiments, video may also be obtained by decompressing and/or decoding an encoded file such as may be stored on the computer-readable medium 212, or stored on the source device 102, as but two examples. In some embodiments, the steps of the present method may be performed on each frame after baseband video is received via a video input connection 108 and processed and/or stored.

Another beneficial application of the presently disclosed systems and methods is for use with a video-editing software program as described above, namely one in which a computer-readable medium embodying the software is configured to identify scene change/non-scene-change transitions based on the present method, thereby aiding a user in locating an appropriate portion of video that is sought to be edited. Notably, a scene change often represents a point of interest for a user for editing purposes. By making use of the identified scene change/non-scene-change transitions, a user may advance through one or more scenes with ease.

Although the presently disclosed systems and methods have been described in terms of select embodiments, alterations and permutations of these embodiments will be apparent to those skilled in the art. Accordingly, the above description of example embodiments does not define or constrain the present system and method.

In particular, it is noted that while some specific embodiments have been described using particular applied algorithms, the presently disclosed systems and methods should not be construed as being limited to those particular implementations. For example, descriptions of iterative techniques can be implemented using recursive techniques, and vice-versa. Further, serial and parallel implementations can be interchanged. Similarly, it is contemplated that the use of logical structures including loops and condition statements can be modified, interchanged, or restricted without departing from the present systems and methods. Finally, it is contemplated that alternative data structure and storage techniques may be employed in implementing the techniques employed in connection with the present systems and methods (e.g., data stored in a table may instead be stored in a linked list, tree, or other data structure). Other changes, substitutions, and alterations are also possible without departing from the present systems and methods in their broader aspects as set forth in the following claims.

The invention claimed is:

1. A non-transitory computer-readable medium containing instructions that, when executed by a processor, cause a set of steps to be carried out for identifying a scene-change/non-scene-change transition for a current frame pair having a first current frame and a second current frame, said set of steps comprising:
receiving said first current frame and said second current frame;
defining a first region of said first current frame and a second region of said second current frame, wherein said regions each have a plurality of lumas within a luma range;
generating a first luma table based on said first region and a second luma table based on said second region, wherein said luma tables each have a luma counter for each luma in said luma range based on said lumas in said corresponding region;
for each luma in said luma range, (i) calculating a first value as a first function of said corresponding luma counter in said first luma table and said corresponding luma counter in said second luma table, (ii) calculating a second value as a second function of said first value, and (iii) adding said second value to an accumulator,
calculating a third value as a function of said accumulator;
identifying said current frame pair as having a scene-change transition responsive to said third value being less than a scene-change threshold; and
storing an indication of an associated scene-change/non-scene-change transition in a memory.

2. The computer-readable medium of claim 1, wherein said first current frame and said second current frame are adjacent frames.

3. The computer-readable medium of claim 2, wherein said luma tables are stored in a register memory accessible by said processor.

4. The computer-readable medium of claim 1, wherein said computer-readable medium is included in a frame-processing device having a video input connection and configured to receive baseband video having a plurality of frames via said video input connection.

5. The computer-readable medium of claim 4, wherein said computer-readable medium is configured for contemporaneously processing each frame to create an encoded file while performing said set of steps for each corresponding frame pair, and wherein performance of said set of steps for each frame pair occurs during an execution time period that is less than a reciprocal of a frame rate of said video.

6. The computer-readable medium of claim 5, wherein said video is received at a transfer rate having a value of 1.485 Gbps, and said execution time period is less than or equal to 1/29.97 seconds.

7. The computer-readable medium of claim 1, wherein said computer-readable medium is electronically connected to a source device and configured to receive video having a plurality of frames, said video being stored as an encoded file on the source device, wherein said computer-readable medium is configured to decode each frame and perform said set of steps for each frame.

8. The computer-readable medium of claim 1, wherein said first region is a generally rectangular-shaped portion of said first current frame, and wherein said second region is a generally rectangular-shaped portion of said second current region.

9. The computer-readable medium of claim 8, wherein said first and second regions are defined by a left-bound column, a right-bound column, a top-bound row, and a bottom-bound row.

10. The computer-readable medium of claim 9, wherein the first and second current frames include a row count of 1080 and a column count of 1920, both defining a resolution of the first and second current frame, and wherein said left-bound column is a value in a range 8-30, said right-bound column is a value in a range 1890-1912, said top-bound row is a value in a range 0-30, and said bottom-bound row is a value in a range 1050-1080.

11. The computer-readable medium of claim 1, wherein said luma range is 0-255 and said scene-change threshold is a value in a range 118-138.

12. The computer-readable medium of claim 1, wherein said scene-change threshold is scaled according to said luma range.

13. The computer-readable medium of claim 1, wherein said first function is a subtraction function and said second function is an inverse of said third function.

14. The computer-readable medium of claim 13, wherein said second function is a square function and said third function is a square-root function.

15. The computer-readable medium of claim 1, wherein in said identifying step, said current frame pair is identified as having a non-scene-change transition responsive to said current frame pair not being identified as having a scene change transition.

16. A frame-processing device comprising:
a processor,
a non-transitory computer-readable medium containing instructions that, when executed by said processor, cause a set of steps to be carried out for identifying a scene-change/non-scene-change transition for a current frame pair having a first current frame and a second current frame, said set of steps comprising:
receiving said first current frame and said second current frame;
defining a first region of said first current frame and a second region of said second current frame, wherein said regions each have a plurality of lumas within a luma range;
generating a first luma table based on said first region and a second luma table based on said second region, wherein said luma tables each have a luma counter for each luma in said luma range based on said lumas in said corresponding region;
for each luma in said luma range, (i) calculating a first value as a first function of said corresponding luma counter in said first luma table and said corresponding luma counter in said second luma table, (ii) calculating a second value as a second function of said first value, and (iii) adding said second value to an accumulator,
calculating a third value as a function of said accumulator;
identifying said current frame pair as having a scene-change transition responsive to said third value being less than a scene-change threshold; and
storing an indication of an associated scene-change/non-scene-change transition in a memory.

17. The frame-processing device of claim 16, wherein said luma tables are stored in a register memory accessible by said processor.

18. The frame-processing device of claim 16, further comprising a video input connection, wherein said frame-processing device is configured to receive baseband video having a plurality of frames via said video input connection, wherein said computer-readable medium is configured for contemporaneously processing each frame to create an encoded file while performing said set of steps for each corresponding frame pair, and wherein performance of said set of steps for each frame pair occurs during an execution time period that is less than a reciprocal of a frame rate of the video.

19. The frame-processing device of claim 16, wherein said first region is a generally rectangular-shaped portion of said first current frame, and wherein said second region is a generally rectangular-shaped portion of said second current region.

20. A method for identifying a scene-change/non-scene-change transition between a current frame pair having a first current frame and a second current frame, said method comprising the steps of:
receiving said first current frame and said second current frame, both from a source device;
defining a first region of said first current frame and a second region of said second current frame, wherein said regions each have a plurality of lumas within a luma range;
generating a first luma table based on said first region and a second luma table based on said second region, wherein said luma tables each have a luma counter for each luma in said luma range based on said lumas in said corresponding region;
for each luma in said luma range, (i) calculating a first value as a first function of said corresponding luma counter in said first luma table and said corresponding luma counter in said second luma table, (ii) calculating a second value as a second function of said first value, and (iii) adding said second value to an accumulator,
calculating a third value as a function of said accumulator;
identifying said current frame pair as having a scene-change transition responsive to said third value being less than a scene-change threshold; and
storing an indication of an associated scene-change/non-scene-change transition in a memory.

* * * * *